(12) United States Patent
Moon et al.

(10) Patent No.: US 11,877,411 B2
(45) Date of Patent: Jan. 16, 2024

(54) ELECTRONIC DEVICE INCLUDING REAR PLATE AND METHOD FOR MANUFACTURING SAME

(71) Applicant: Samsung Electronics Co., Ltd., Gyeonggi-do (KR)

(72) Inventors: Youngmin Moon, Gyeonggi-do (KR); Hyeonbeom Kim, Gyeonggi-do (KR); Jaehyun Bae, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 170 days.

(21) Appl. No.: 17/434,798

(22) PCT Filed: Mar. 9, 2020

(86) PCT No.: PCT/KR2020/003257
§ 371 (c)(1),
(2) Date: Aug. 30, 2021

(87) PCT Pub. No.: WO2020/189938
PCT Pub. Date: Sep. 24, 2020

(65) Prior Publication Data
US 2022/0167517 A1    May 26, 2022

(30) Foreign Application Priority Data

Mar. 21, 2019    (KR) ........................ 10-2019-0032364

(51) Int. Cl.
*H05K 5/03*    (2006.01)
*G06F 1/16*    (2006.01)

(52) U.S. Cl.
CPC ............. *H05K 5/03* (2013.01); *G06F 1/1626* (2013.01)

(58) Field of Classification Search
CPC ....... H05K 5/03; G06F 1/1626; G06F 1/1656; G06F 1/1628; G06F 1/1635; G06F 2200/1635; G02F 1/1333; G02F 1/133308
See application file for complete search history.

(56) References Cited

U.S. PATENT DOCUMENTS

| | | | |
|---|---|---|---|
| 7,776,423 B2 * | 8/2010 | Suga | ........................ B32B 3/00 428/161 |
| 9,724,869 B2 * | 8/2017 | Niskala | ................. G06F 1/1652 |

(Continued)

FOREIGN PATENT DOCUMENTS

| | | |
|---|---|---|
| JP | 2003-15731 A | 1/2003 |
| KR | 10-2016-0046119 A | 4/2016 |

(Continued)

OTHER PUBLICATIONS

Chinese Office Action dated Nov. 3, 2023.

*Primary Examiner* — Anthony M Haughton
*Assistant Examiner* — Theron S Milliser
(74) *Attorney, Agent, or Firm* — Cha & Reiter, LLC

(57) ABSTRACT

An electronic device including a rear plate, and the rear plate itself are disclosed. The rear plate covers a rear surface of the electronic device, and includes: a glass plate including a pattern area, the pattern area including a pattern having a designated shape, in at least a partial area of the glass plate, a printed layer disposed on a first surface of the glass plate, a shielding layer stacked with the printed layer, and a coating layer disposed on a second surface of the glass plate opposite to the first surface, wherein the pattern area of the glass plate includes a plurality of processing lines spaced apart from each other.

14 Claims, 15 Drawing Sheets

(56) References Cited

U.S. PATENT DOCUMENTS

| | | | |
|---|---|---|---|
| 10,365,689 B2 * | 7/2019 | Park | G06F 1/1643 |
| 10,409,331 B2 * | 9/2019 | Park | G06F 3/0446 |
| 10,448,529 B2 * | 10/2019 | Han | B32B 17/06 |
| 10,562,273 B2 * | 2/2020 | Liu | B32B 17/06 |
| 2006/0266734 A1 | 11/2006 | Fuji et al. | |
| 2007/0026197 A1 * | 2/2007 | Suga | B32B 27/06 264/510 |
| 2016/0113135 A1 | 4/2016 | Kim et al. | |
| 2016/0192474 A1 * | 6/2016 | Niskala | G06F 1/1652 361/679.55 |
| 2016/0255735 A1 * | 9/2016 | Han | G06F 1/1637 359/894 |
| 2016/0349798 A1 * | 12/2016 | Park | G06F 3/04164 |
| 2017/0075386 A1 * | 3/2017 | Park | G06F 1/1637 |
| 2017/0097661 A1 * | 4/2017 | Park | G06F 1/1626 |
| 2017/0217056 A1 | 8/2017 | Abbatiello et al. | |
| 2018/0003359 A1 | 1/2018 | Ying et al. | |
| 2018/0117880 A1 * | 5/2018 | Liu | B32B 38/145 |
| 2019/0037694 A1 | 1/2019 | Koo et al. | |
| 2022/0071036 A1 | 3/2022 | Chuang et al. | |

FOREIGN PATENT DOCUMENTS

| | | |
|---|---|---|
| KR | 10-2017-0102220 A | 9/2017 |
| KR | 10-1797925 B1 | 10/2017 |
| KR | 10-2018-0007634 A | 1/2018 |
| KR | 10-2018-0023536 A | 3/2018 |
| KR | 10-2018-0035037 A | 4/2018 |
| KR | 10-1897672 B1 | 10/2018 |
| KR | 10-2019-0011994 A | 2/2019 |
| WO | 2018/103229 A1 | 6/2018 |

* cited by examiner

<STEP 11>

<STEP 12>

<STEP 13>

ELECTRONIC DEVICE INCLUDING REAR PLATE AND METHOD FOR MANUFACTURING SAME

CROSS-REFERENCE TO RELATED APPLICATIONS

This application is a National Phase Entry of PCT International Application No. PCT/KR2020/003257, which was filed on Mar. 9, 2020, and claims a priority to Korean Patent Application No. 10-2019-0032364, which was filed on Mar. 21, 2019, the contents of which are incorporated herein by reference.

TECHNICAL FIELD

Certain embodiments of the disclosure relate to a rear plate, an electronic device including the same, and a method for manufacturing a rear plate.

BACKGROUND ART

The term "electronic device" may indicate a device capable of performing a particular function according to installed programs, and may include devices such as a home appliance, an electronic scheduler, a portable multimedia player, a mobile communication terminal, a tablet PC, a video/sound device, a desktop PC or laptop computer, a navigation for automobile, etc. For example, electronic devices may output voice/audio or imagery. As electronic devices are highly integrated, and high-speed, high-volume wireless communication becomes commonplace, such electronic device, such as smartphones and other mobile communication terminals, are increasingly equipped with various functions. For example, an electronic device includes integrated entertainment functionality, such as entertainment functions like playing video games, multimedia functions like replaying music/videos, communication and security functions such as mobile banking, scheduling functions and e-wallet functions.

The recent trend to emphasize slimness and compactness for smartphones, laptop computers, or other electronic devices has led to adoption of elegant glass parts for use as exterior components for commercial electronic devices. Further, various surface treatment techniques have been developed to provide functional effects in addition to design effects.

DETAILED DESCRIPTION OF THE INVENTION

Technical Problem

The portability of electronic devices such as smart phones or laptop computers is increasingly important. As a result, high strength components are utilized for exterior materials, and aesthetic considerations are more important, including through various visual or tactile patterns. For example, an external cover, such as a glass cover, having a curved surface, and formed via thermoforming, may provide superior grip and aesthetic appeal. Furthermore, a pattern may be printed or laminated on as a film (e.g., Decofilm), to a particular area of the cover, such as the curved portion, to add aesthetic value to the product.

However, forming this pattern through additional processes performed after thermoforming may result in limitations to visual and sensory design differentiations. Further, the additional process may consume materials and time, creating an obstacle to efficient production.

According to certain embodiments of the disclosure, a rear plate of an electronic device is provided as to include a cover in which a pattern is formed thereon during thermoforming, satisfying requirements of depth, demand and design.

According to certain embodiments of the disclosure, for the aforementioned rear plate and electronic device having the same, it is possible to reduce material and time costs by forming the curved surface and patterning the same during the thermoforming process.

Technical Solution

According to certain embodiments of the disclosure, a rear plate covering a rear surface of an electronic device may include a glass plate including a pattern area including a pattern having a designated shape, in at least a partial area of the glass plate, a printed layer disposed on a first surface of the glass plate, a shielding layer stacked with the printed layer, and a coating layer disposed on a second surface, opposite to the first surface, of the glass plate. The pattern area of the glass plate may include a plurality of processing lines spaced apart from each other.

According to certain embodiments of the disclosure, an electronic device may include a housing including a front plate facing in a first direction and a rear plate facing in a second direction opposite to the front plate, at least a portion of the front plate including a transparent area, a battery disposed inside the housing, and a display disposed in the housing and including a screen area exposed through the front cover. The rear plate may include a glass plate including a pattern area including a pattern having a designated shape, in at least a partial area of the glass plate, a printed layer disposed on the glass plate in the first direction, a shielding layer stacked with the printed layer, and a coating layer disposed on the glass plate in the second direction opposite to the first direction. The pattern area of the glass plate may include a plurality of processing lines spaced apart from each other.

According to certain embodiments of the disclosure, a method for manufacturing a rear plate may include a step in which a glass plate is inserted into a mold structure and is seated in an area of a lower core structure of the mold structure, a step in which the glass plate is pre-heated at a high temperature, and an upper core structure of the mold structure descends toward the lower core structure, a step in which shape processing portions of the upper core structure and the lower core structure press the glass plate to form a curved surface, and a cooling step.

Advantageous Effects

According to certain embodiments of the disclosure, in an electronic device, it is possible to provide an exterior material with aesthetic design.

According to certain embodiments of the disclosure, in a rear plate and an electronic device including the same, it is possible to form processing lines in a pattern by forming a rear plate pattern during thermoforming. Thus, it is possible to offer a cover enhanced in light of design.

According to certain embodiments of the disclosure, in a rear plate and an electronic device including the same, no additional process for patterning is needed, thereby saving costs due to material and time while minimizing defects that may occur after assembly.

MODE FOR CARRYING OUT THE INVENTION

Figure 1:
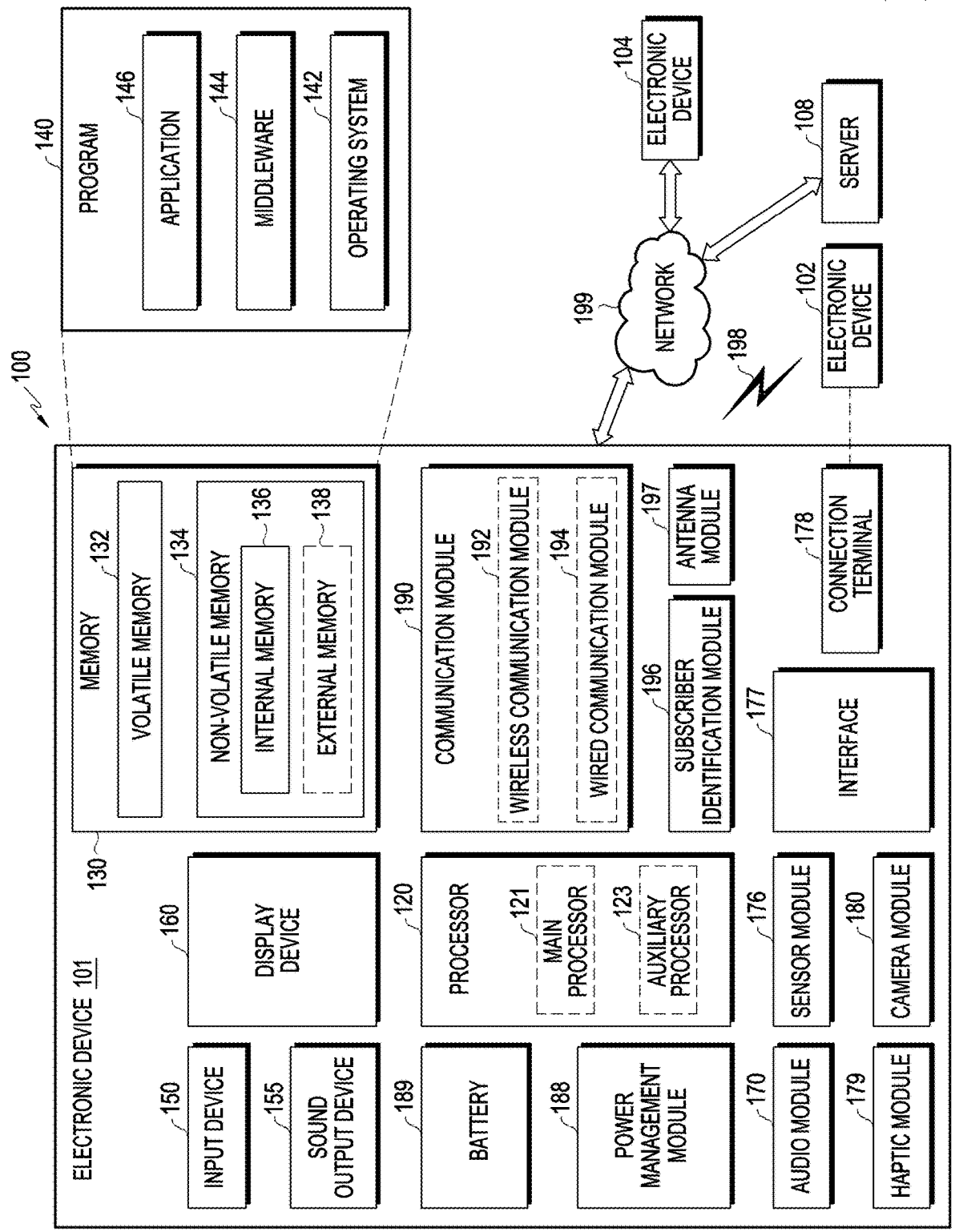
FIG. 1 is a block diagram illustrating an example electronic device in a network environment according to certain embodiments of the disclosure.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from an exterior (e.g., a user) of the electronic device 101. The input device 150 may include, for example, a microphone, a mouse, a keyboard, or a digital pen (e.g., a stylus pen).

The sound output device 155 may output sound signals to an exterior of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to an exterior (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high-definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from an exterior (e.g., the external electronic device). According to an embodiment, the antenna module may include one antenna including a radiator formed of a conductor or conductive pattern formed on a substrate (e.g., a printed circuit board (PCB)). According to an embodiment, the antenna module 197 may include a plurality of antennas. In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to certain embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

According to an embodiment, a partial configuration of the electronic device may have an injection-molded surface resulting from injection molding. The injection-molded surface formed by the injection molding structure may include an outer surface of the electronic device or may support various electronic components inside the electronic device.

Figure 2:
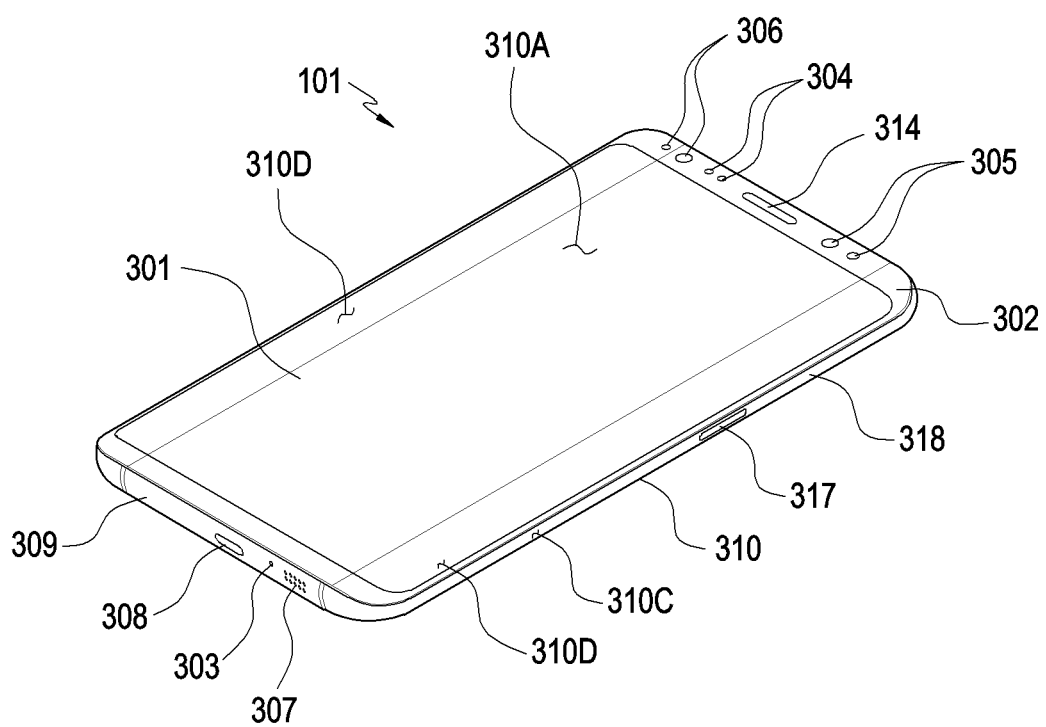
FIG. 2 is a front perspective view illustrating an example electronic device according to certain embodiments of the disclosure.
Figure 3:
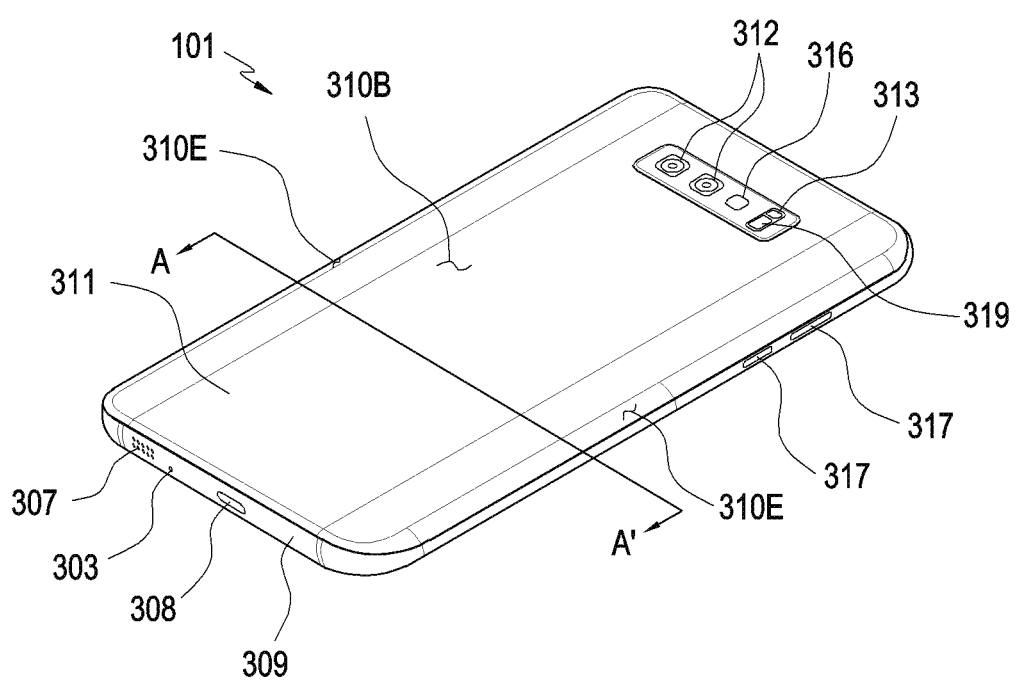
FIG. 3 is a rear perspective view illustrating an example electronic device according to certain embodiments of the disclosure.

FIG. 2 is a front perspective view illustrating an electronic device according to certain embodiments of the disclosure;

FIG. 3 is a rear perspective view illustrating an electronic device according to certain embodiments of the disclosure;

Referring to FIGS. 2 and 3, according to an embodiment, an electronic device 101 may include a housing 310 with a first (or front) surface 310A, a second (or rear) surface 310B, and a side surface 310C surrounding a space between the first surface 310A and the second surface 310B. According to another embodiment (not shown), the housing may denote a structure forming part of the first surface 310A, the second surface 310B, and the side surface 310C of FIG. 2. According to an embodiment, at least part of the first surface 310A may have a substantially transparent front plate 302 (e.g., a glass plate or polymer plate including various coat layers). The second surface 310B may be formed by a rear plate 311 that is substantially opaque. The rear plate 311 may be formed of, e.g., laminated or colored glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes a metal and/or polymer. According to an embodiment, the rear plate 311 and the side bezel plate 318 may be integrally formed together and include the same material (e.g., a metal, such as aluminum).

In the embodiment illustrated, the front plate 302 may include two first regions 310D, which seamlessly and bendingly extend from the first surface 310A to the rear plate 311, on both the long edges of the front plate 302. In the embodiment (refer to FIG. 3) illustrated, the rear plate 311 may include two second regions 310E, which seamlessly and bendingly extend from the second surface 310B to the front plate, on both the long edges. According to an embodiment, the front plate 302 (or the rear plate 311) may include one of the first regions 310D (or the second regions 310E). Alternatively, the first regions 310D or the second regions 301E may partially be excluded. According to an embodiment, at side view of the electronic device 101, the side bezel structure 318 may have a first thickness (or width) for sides that do not have the first regions 310D or the second regions 310E and a second thickness, which is smaller than the first thickness, for sides that have the first regions 310D or the second regions 310E.

According to an embodiment, the electronic device 101 may include at least one or more of a display 301, audio modules 303, 307, and 314, sensor modules 304, 316, and 319, camera modules 305, 312, and 313, key input devices 317, a light emitting device 306, and connector holes 308 and 309. According to an embodiment, the electronic device 101 may exclude at least one (e.g., the key input device 317 or the light emitting device 306) of the components or may add other components.

According to an embodiment, the display 301 may be exposed through, e.g., a majority portion of the front plate 302. According to an embodiment, at least a portion of the display 301 may be exposed through the front plate 302 forming the first surface 310A and the first regions 310D of the side surface 310C. According to an embodiment, the edge of the display 301 may be formed to be substantially the same in shape as an adjacent outer edge of the front plate 302. According to an embodiment (not shown), the interval between the outer edge of the display 301 and the outer edge of the front plate 302 may remain substantially even to give a larger area of exposure the display 301.

According to an embodiment (not shown), the screen display region of the display 301 may have a recess or opening in a portion thereof, and at least one or more of the audio module 314, sensor module 304, camera module 305, and light emitting device 306 may be aligned with the recess or opening. According to an embodiment (not shown), at least one or more of the audio module 314, sensor module 304, camera module 305, fingerprint sensor 316, and light emitting device 306 may be included on the rear surface of the screen display region of the display 301. According to an embodiment (not shown), the display 301 may be disposed to be coupled with, or adjacent, a touch detecting circuit, a pressure sensor capable of measuring the strength (pressure) of touches, and/or a digitizer for detecting a magnetic field-type stylus pen. According to an embodiment, at least part of the sensor modules 304 and 319 and/or at least part of the key input device 317 may be disposed in the first regions 310D and/or the second regions 310E.

According to an embodiment, the audio modules 303, 307, and 314 may include a microphone hole and speaker holes. The microphone hole may have a microphone inside to obtain external sounds. According to an embodiment, there may be a plurality of microphones to be able to detect the direction of a sound. The speaker holes may include an external speaker hole and a phone receiver hole. According to an embodiment, the speaker holes and the microphone hole may be implemented as a single hole, or speakers may be rested without the speaker holes (e.g., piezo speakers).

According to an embodiment, the sensor modules 304, 316, and 319 may generate an electrical signal or data value corresponding to an internal operating state or external environmental state of the electronic device 101. The sensor modules 304, 316, and 319 may include a first sensor module 304 (e.g., a proximity sensor) and/or a second sensor module (not shown) (e.g., a fingerprint sensor) disposed on the first surface 310A of the housing 310 and/or a third sensor module 319 (e.g., a heart-rate monitor (HRM) sensor) and/or a fourth sensor module 316 (e.g., a fingerprint sensor) disposed on the second surface 310B of the housing 310. The fingerprint sensor may be disposed on the second surface 310B as well as on the first surface 310A (e.g., the display 301) of the housing 310. The electronic device 101 may further include sensor modules not shown, e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 304.

According to an embodiment, the camera modules 305, 312, and 313 may include a first camera device 305 disposed on the first surface 310A of the electronic device 101, and a second camera device 312 and/or a flash 313 disposed on the second surface 310B. The camera modules 305 and 312 may include one or more lenses, an image sensor, and/or an image signal processor. The flash 313 may include, e.g., a light emitting diode (LED) or a xenon lamp. According to an embodiment, two or more lenses (an infrared (IR) camera, a wide-angle lens, and a telescopic lens) and image sensors may be disposed on one surface of the electronic device 101.

According to an embodiment, the key input device 317 may be disposed on the side surface 310C of the housing 310. According to an embodiment, the electronic device 101 may exclude all or some of the above-mentioned key input devices 317 and the excluded key input devices 317 may be implemented in other forms, e.g., as soft keys, on the display 301. According to an embodiment, the key input device may include the sensor module 316 disposed on the second surface 310B of the housing 310.

According to an embodiment, the light emitting device 306 may be disposed on, e.g., the first surface 310A of the housing 310. The light emitting device 306 may provide, e.g., information about the state of the electronic device 101 in the form of light. According to an embodiment, the light emitting device 306 may provide a light source that interacts with, e.g., the camera module 305. The light emitting device 306 may include, e.g., a light emitting device (LED), an infrared (IR) LED, or a xenon lamp.

According to an embodiment, the connector holes 308 and 309 may include a first connector hole 308 for receiving a connector (e.g., a universal serial bus (USB) connector) for transmitting or receiving power and/or data to/from an external electronic device and/or a second connector hole (e.g., an earphone jack) 309 for receiving a connector for transmitting or receiving audio signals to/from the external electronic device.

Figure 4:
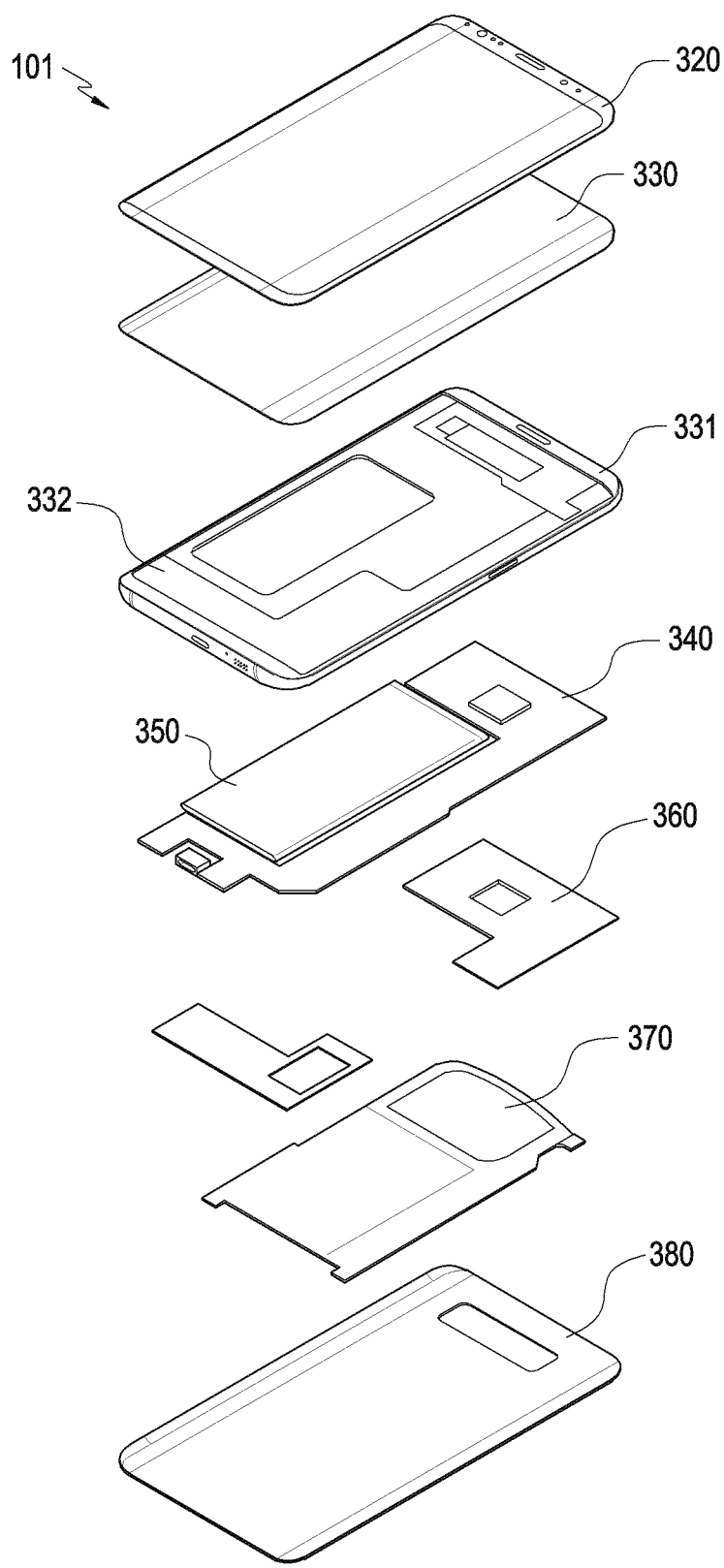
FIG. 4 is an exploded perspective view illustrating an example electronic device according to certain embodiments of the disclosure.

FIG. 4 is an exploded perspective view illustrating an electronic device according to certain embodiments of the disclosure.

Referring to FIG. 4, an electronic device 101 (e.g., the electronic device 101 of FIGS. 1 to 3) may include a side bezel structure 331, a first supporting member 332 (e.g., a bracket), a front plate 320, a display 330, a printed circuit board (PCB) 340, a battery 350, a second supporting member 360 (e.g., a rear case), an antenna 370, and a rear plate 380 (e.g., the rear plate 311 of FIG. 3). According to an embodiment, the electronic device 101 may exclude at least one (e.g., the first supporting member 332 or second supporting member 360) of the components or may add other components. At least one of the components of the electronic device 101 may be the same or similar to at least one of the components of the electronic device 101 of FIG. 2 or 3 and no duplicate description is made below.

According to an embodiment, the first supporting member 332 may be disposed inside the electronic device 101 to be connected with the side bezel structure 331 or integrated with the side bezel structure 331. The first supporting member 332 may be formed of, e.g., a metal and/or non-metallic material (e.g., polymer). The display 330 may be joined onto one surface of the first supporting member 332, and the printed circuit board 340 may be joined onto the opposite surface of the first supporting member 311. A processor, memory, and/or interface may be mounted on the printed circuit board 340. The processor may include one or more of, e.g., a central processing unit, an application processor, a graphic processing device, an image signal processing, a sensor hub processor, or a communication processor.

According to an embodiment, the memory may include, e.g., a volatile or non-volatile memory.

According to an embodiment, the interface may include, for example, a high-definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

According to an embodiment, the battery 350 may be a device for supplying power to at least one component of the electronic device 101. The battery 189 may include, e.g., a primary cell which is not rechargeable, a secondary cell which is rechargeable, or a fuel cell. At least a portion of the battery 350 may be disposed on substantially the same plane as the printed circuit board 340. The battery 350 may be integrally or detachably disposed inside the electronic device 101.

According to an embodiment, the antenna 370 may be disposed between the rear plate 380 and the battery 350. The antenna 370 may include, e.g., a near-field communication (NFC) antenna, a wireless charging antenna, and/or a magnetic secure transmission (MST) antenna. The antenna 370 may perform short-range communication with, e.g., an external device or may wirelessly transmit or receive power utilized for charging. According to an embodiment, an antenna structure may be formed by a portion or combination of the side bezel structure 331 and/or the first supporting member 332.

Figure 5:
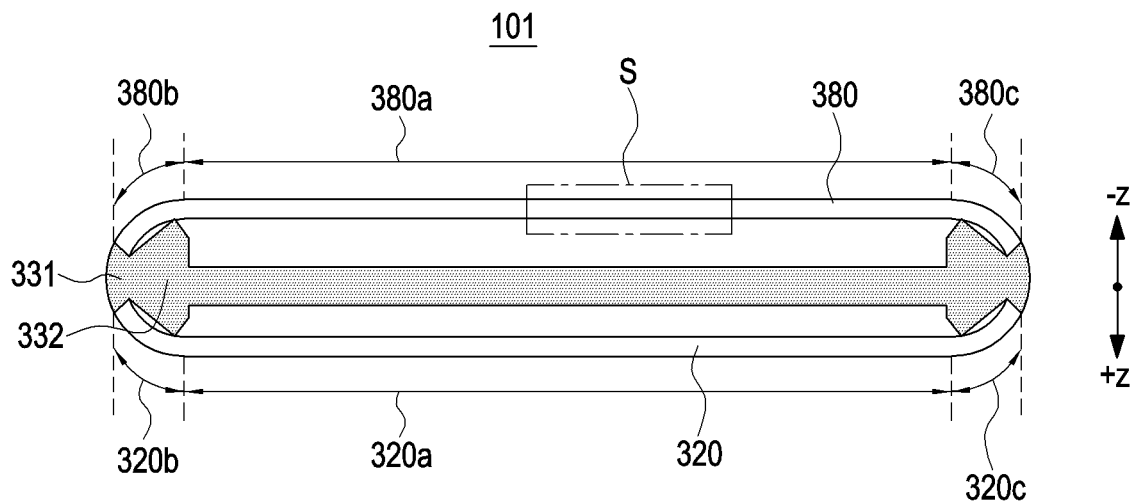
FIG. 5 is a cross-sectional view taken along line A-A' of the example electronic device FIG. 3 according to certain embodiments of the disclosure.
Figure 6:
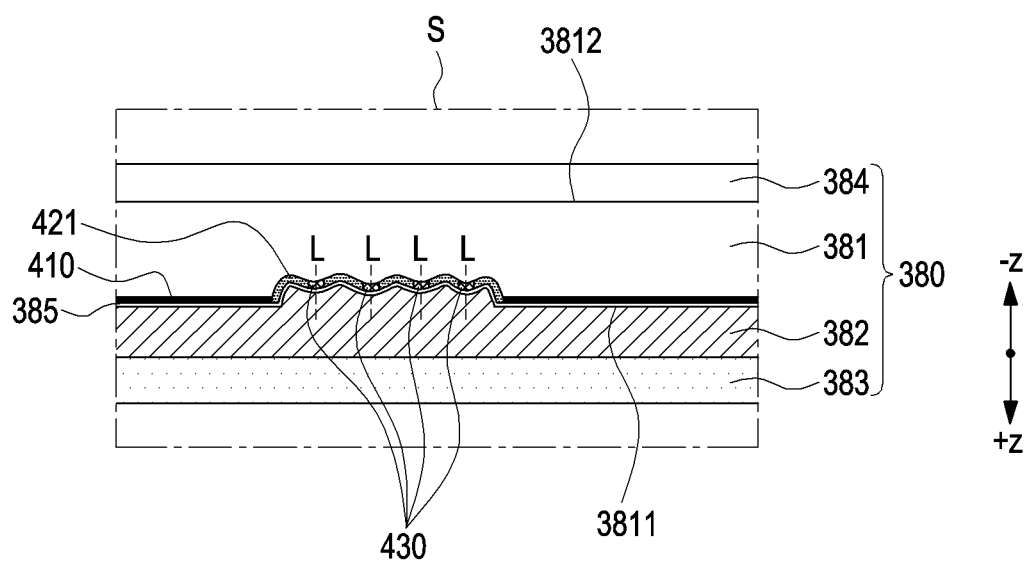
FIG. 6 is an enlarged, cross-sectional view illustrating an area S of FIG. 5 according to an example embodiment of the disclosure.

FIG. 5 is a cross-sectional view taken along line A-A' of the electronic device FIG. 3 according to certain embodiments of the disclosure. FIG. 6 is an enlarged, cross-sectional view illustrating an area S of FIG. 5 according to an embodiment of the disclosure.

Referring to FIGS. 5 and 6, an electronic device (e.g., the electronic device 101 of FIGS. 1 to 3) includes a housing 310 for mounting electronic components. The housing 310 may include a front plate 320, a rear plate 380, a side bezel structure 331, and a bracket 332. The side bezel structure 331 and the bracket 332 may be integrally formed with each other. The front plate 320, the rear plate 380, the side bezel structure 331, and the bracket 332 of FIGS. 5 and 6 may be identical in whole or part to the front plate 320, the rear plate 380, the side bezel structure 331, and the first supporting member 332 of FIG. 4.

According to certain embodiments, the bracket 332 provides a space for receiving a plurality of electronic components. The side bezel structure 331 may be formed to surround at least a portion of the bracket 332, covering a side surface of the electronic device 101. To cover the internal space where the plurality of electronic components are received, the bracket 332 and the side bezel structure 331 may be connected forward to a display (e.g., the display 330 of FIG. 3) and the front plate 320 and backward to the rear plate 380 of FIG. 3.

According to certain embodiments, the front plate 320 and/or the rear plate 380 may include a flat portion and curved portions. For example, the front plate 320 as depicted has a 1-1th curved portion 320b and a 1-2th curved portion 320c at two opposite ends thereof, which extend from a first flat portion 320a disposed in the middle. The 1-1th curved portion 320b and the 1-2th curved portion 320c may be implemented in shapes corresponding to each other and may seamlessly extend to the rear plate 380. As another example, the rear plate 380 has a 2-1th curved portion 380b and a 2-2th curved portion 380c at two opposite ends thereof, which extend from a second flat portion 380a disposed in the middle. The 2-1th curved portion 380b and the 2-2th curved portion 380c may be implemented in shapes corresponding to each other and may seamlessly extend to the front plate 320.

According to certain embodiments, the rear plate 380 may include a stack of a plurality of layers. For example, the rear plate 380 may include a printed layer 382 and a shielding layer 383 disposed in a first direction +Z from a glass plate 381. As another example, a coating layer 384 may be disposed in a second direction (−Z), which is opposite to the first direction (Z), from the glass plate 381.

As another example, the front plate 320 may include a stack of a plurality of layers. For example, the front plate 320 may include a printed layer and a shielding layer disposed in the second direction −Z from a glass plate. As another example, a coating layer may be disposed in the first direction (+Z), which is opposite to the second direction (−Z), from the glass plate. The structure of the front plate 320 having the stack of the plurality of layers may be formed in an inactive region (e.g., a BM area), but not in an active area in which a display (e.g., the display 301 of FIGS. 2 and 3) is disposed. The structure of the rear plate 380 described below may be applied to the structure of the front plate 320 having the stack of the plurality of layers.

According to certain embodiments, the glass plate 381 may include a first surface 3811 facing in the first direction +Z and a second surface 3812 facing in the second direction −Z which is opposite to the first direction +Z. The first surface 3811 and/or the second surface 3812 of the glass plate 381 may include a base area 410 and a pattern area 421. For example, at least a partial area of the first surface 3811 includes a non-patterned base area 410, and an area, other than the base area 410, of the first surface 3811 may include a pattern region 421 having a designated first thickness. The pattern area 421 may be formed with a pattern having a designated shape, and may extend inwardly or from an end of the base area 410. The first thickness may provide a sense of depth of the pattern formed in the pattern area 421. The pattern may be defined as a plurality of repeated motifs, styles, or shapes. Various types of patterns may be formed by the worker.

According to certain embodiments, a designated shape of pattern formed in the pattern area 421 may be implemented with recesses (e.g., shapes recessed inward in the glass plate) formed in the first surface 3811 of the glass plate 381 and may be formed by an embossed pattern formed in a mold structure for forming. For example, the embossed pattern formed in a pattern portion of the mold structure may form the pattern area 421 of the glass plate 381 as an engraved pattern.

According to certain embodiments, a plurality of processing lines 430 may be included in each designated shape pattern formed in the pattern area 421. The plurality of processing lines 430 may form a regularly or repeatedly designated line structure. For example, the processing lines 430 formed in the pattern area 421 may be formed along a direction (e.g., the first direction +Z or the second direction −Z) perpendicular to the surface where the pattern is formed along designated virtual lines L. As another example, the processing lines 430 may be spaced apart from each other at predetermined intervals. The plurality of processing lines 430 may be a pattern formed by thermoforming, and may be a feature that appears as a processing pattern of the machine processing the thermoforming mold is transferred into the pattern area 421. The plurality of processing lines 430, together with the pattern of the designated shapes, may provide an aesthetic design to the glass plate 381.

According to certain embodiments, the base area 410 and the pattern area 421 may be implemented simultaneously with the formation of the flat area and the curved area of the rear plate 380. For example, the process for pattern transfer (formation) of the glass plate 381 may engraving a designated pattern and form the overall shape of the glass plate 381 while simultaneously forming the pattern area in the glass plate 381 using a mold structure corresponding to the overall shape of the glass plate 381. Accordingly, the glass plate 381 may implement a three-dimensional and emotional design. Details of the pattern transfer (formation) process of the glass plate 381 are described below.

According to certain embodiments, the printed layer 382 may be disposed on the glass plate 381 in the first direction +Z. The printed layer 382 includes at least one layer, and when including a plurality of layers, each layer may be formed of a different material. For example, a background printed layer may be formed of a material using black ink and may be manufactured through a background printing process. As another example, a color printed layer may be formed of a material including any color and may be manufactured through a color printing process. The background printed layer may provide a three-dimensional effect to another layer providing color, and the color printed layer may directly provide a color to the rear plate 380.

According to an embodiment, at least a partial area of the printed layer 382 may be provided in a shape corresponding to the first surface 3811 of the glass plate 381. For example, when the pattern, in the designated shape, of the pattern area 421 of the glass plate 381 has a recessed structure or a protruding structure in the glass plate 381, the outer surface of the printed layer 382 corresponding to the pattern area 421 may be prepared in a protruding structure or recessed structure corresponding to the recesses or grooves, filling the space formed in the pattern area 421.

According to certain embodiments, a transparent member layer 385 may be disposed between the glass plate 381 and the printed layer 382. The transparent member layer 385 may include a dielectric layer, a base film layer, and a primer layer. The base film layer may be formed of a transparent insulating substrate, such as glass or a polymer film, and when the substrate is formed of a polymer film, it may include a flexible substrate. The dielectric layer may be disposed in contact with the glass plate 381 may be prepared by applying, e.g., a known composition without limitations, as an optically transparent adhesive layer. For example, the dielectric layer may be formed of an acrylic adhesive. As another example, the dielectric layer may include at least one of silicon, air, foam, membrane, optical clear adhesive (OCA), sponge, rubber, ink, and polymer (PC or PET).

According to certain embodiments, a deposition layer (not shown) may be disposed between the transparent member layer 385 and the printed layer 382. The deposition layer may be manufactured by a physical vapor deposition (PVD) method, such as sputtering. The deposition layer may be formed of at least one or more layers. For example, the deposition layer formed as a single layer may be manufactured to include In oxide and an additional additive, using an electron beam (E-beam) evaporator. The additional additive may include at least one of $TiO_2$, $SiO_2$, or $Al_2O_3$. As another example, the deposition layer formed as multi layers may be formed by alternately depositing two materials having different reflectivity (e.g., using In oxide and at least one of $TiO_2$, $SiO_2$, or $Al_2O_3$), using an electron beam (E-beam) evaporator. When the deposition layer is formed by sputtering, it may be deposited including at least one of a material, such as $Nb_2O_5$, ZnS, TiO, SiO, Al, Sn, or Tin.

According to an embodiment of the disclosure, when the printed layer 382 is provided as a base layer, it may be stacked together with the deposition layer, and when provided as a color layer having an arbitrary color of the printed layer 382, the deposition layer may be optionally removed.

According to certain embodiments, the shielding layer 383 may be disposed on the glass plate 381 in the first direction +Z. The shielding layer 383 may be stacked on the printed layer 382 and may include at least one layer. When the shielding layer 383 includes a plurality of layers, each layer may be formed of a different material. The shielding layer 383 may block a path of light directed to an exterior or the interior of the electronic device 101. For example, the shielding layer 383 may prevent light leakage of the electronic device 101 or block the light provided to the electronic device 101 from an exterior. According to an embodiment, the shielding layer 383 may be formed of a material using black ink, and may be manufactured through a light blocking printing process.

According to certain embodiments, the coating layer 384 may be disposed on the glass plate 381 in the second direction −Z. The coating layer 384 may be formed by being overall coated on the second surface 3812 of the glass plate 381. The coating layer 384 has a thickness smaller than that of the glass plate 381, and is disposed to surround the outer surface of the electronic device 101 to prevent penetration of foreign substances or contamination.

Figure 7:
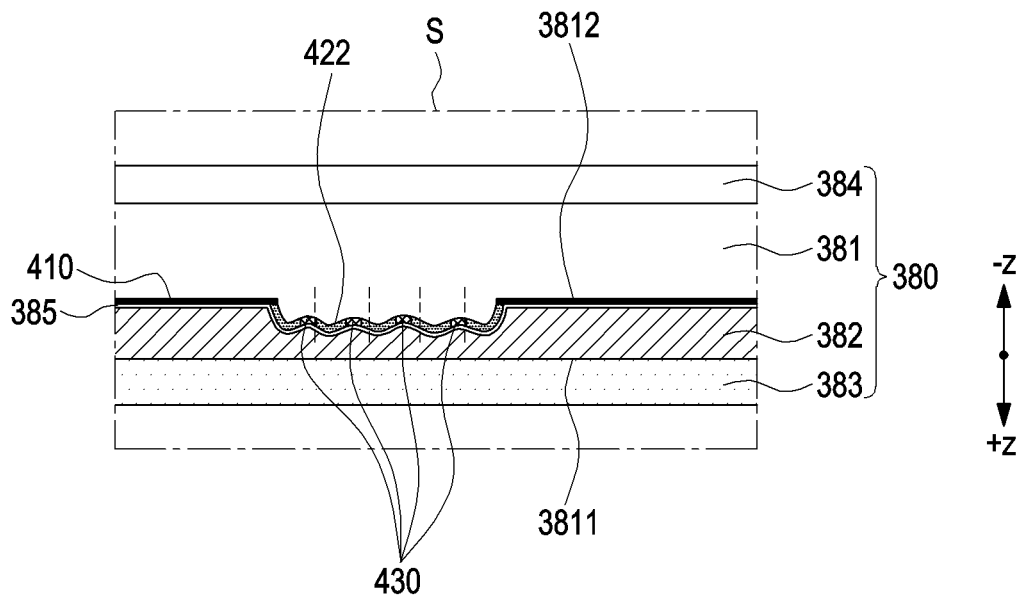
FIG. 7 is an enlarged, cross-sectional view illustrating an area of FIG. 5 according to another example embodiment of the disclosure.

FIG. 7 is an enlarged, cross-sectional view illustrating an area of FIG. 5 according to another embodiment of the disclosure.

Referring to FIG. 7, an electronic device (e.g., the electronic device 101 of FIGS. 1 to 3) includes a rear plate 380, and the rear plate 380 may include a glass plate 381, a printed layer 382, and a shielding layer 383 sequentially arranged on a coating layer 384 in a first direction +Z. The configuration of the rear plate 380 of FIG. 7 may be identical in whole or part to the configuration of the rear plate 380 of FIGS. 5 and 6.

The following description focuses primarily on differences according to the pattern direction of the glass plate 381.

According to certain embodiments, the glass plate 381 may include a first surface 3811 facing in the first direction +Z and a second surface 3812 facing in the second direction −Z which is opposite to the first direction +Z. The first surface 3811 of the glass plate 381 may include a base area 410 and a pattern area 422.

According to certain embodiments, a designated shape of pattern formed in the pattern area 422 may have a shape protruding from the first plate 3811 of the glass plate 381 to an exterior (e.g., in the first direction +Z) and may be formed by an engraved pattern of a mold structure. For example, the engraved pattern may form the pattern area 422 of the glass plate 381 as an embossed pattern. According to an embodiment, a plurality of processing lines 430 may be included in each designated shape pattern in the pattern area 422, including the protruding structure.

According to certain embodiments, the printed layer 382 may be disposed on the glass plate 381 in the first direction +Z. At least a partial area of the printed layer 382 may be provided in a shape corresponding to the first surface 3811 of the glass plate 381. For example, when the designated shape of pattern of the pattern area 422 of the glass plate 381 has a structure protruding outward of the glass plate 381, the outer surface of the printed layer 382 may be prepared in a recessed or grooved structure corresponding to the protruding structure to surround the pattern area 422.

Although the embodiments described in connection with FIG. 6 or 7 indicate that the designated shapes of pattern of the pattern area 421 or 422 of the first surface 3811 of the glass plate 381 are recessed or protruded, embodiments of the disclosure are not limited thereto, but various design changes may rather be made thereto. For example, various patterns formed in a recessed structure and protruding structure may be together formed on the first surface 3811 of the glass plate 381.

Figure 8:
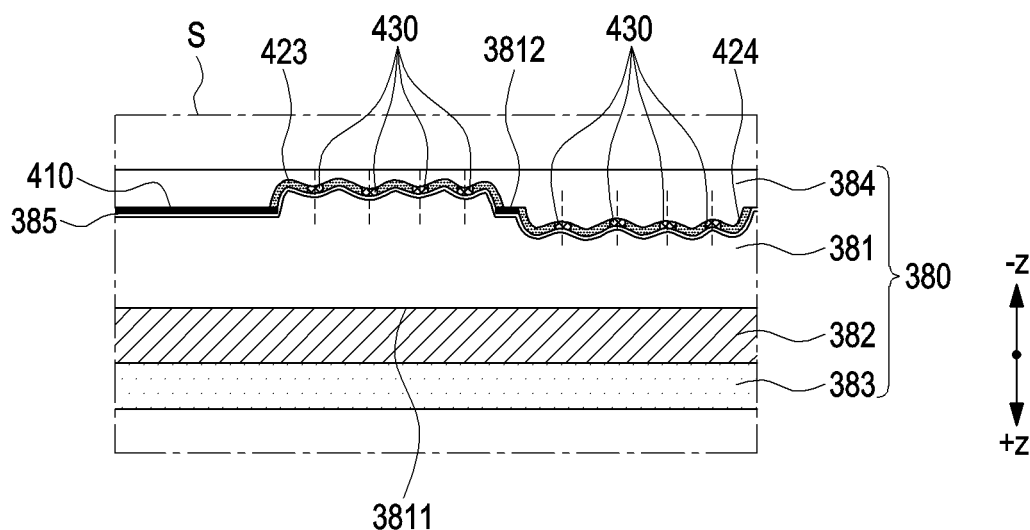
FIG. 8 is an enlarged, cross-sectional view illustrating an area of FIG. 5 according to another example embodiment of the disclosure.

FIG. 8 is an enlarged, cross-sectional view illustrating an area of FIG. 5 according to another embodiment of the disclosure.

Referring to FIG. 8, an electronic device (e.g., the electronic device 101 of FIGS. 1 to 3) includes a rear plate 380, and the rear plate 380 may include a glass plate 381, a printed layer 382, and a shielding layer 383 sequentially arranged on a coating layer 384 in a first direction +Z. The configuration of the rear plate 380 of FIG. 7 may be identical in whole or part to the configuration of the rear plate 380 of FIGS. 5 and 6.

The following description focuses primarily on differences according to the surface where the pattern area is formed and the pattern direction.

According to certain embodiments, the glass plate 381 may include a first surface 3811 facing in the first direction +Z and a second surface 3812 facing in the second direction −Z which is opposite to the first direction +Z. The first surface 3811 of the glass plate 381 may include a base area 410 and pattern areas 423 and 424.

According to certain embodiments, a designated shape of pattern formed in the pattern area 423 may include a shape protruding from the second plate 3812 of the glass plate 381 to an exterior (e.g., in the second direction −Z) and may be formed by an engraved pattern in a mold structure. According to another embodiment, a designated shape of pattern formed in the pattern area 424 may be implemented with recesses (e.g., shapes recessed inward in the glass plate) formed in the second surface 3812 of the glass plate 381, and may be formed by an embossed pattern formed in a mold structure for forming. According to an embodiment, a plurality of processing lines 430 may be included in each designated shape pattern formed in the pattern areas 423 and 424.

According to certain embodiments, the coating layer 384 may be disposed on the glass plate 381 in the second direction −Z. At least a partial area of the printed layer 382 may be provided in a shape corresponding to the second surface 3812 of the glass plate 381. For example, when the pattern shape formed in the pattern area 422 of the glass plate 381 has a structure protruding outward of the glass plate 381, the outer surface of the coating layer 384 may be prepared in a recessed or grooved structure corresponding to the protruding structure to surround the pattern area 423. As another example, when the pattern, in the designated shape, of the pattern area 424 of the glass plate 381 has a recessed structure or a protruding structure in the glass plate 381, the outer surface of the coating layer 384 corresponding to the pattern area 424 may be prepared in a protruding structure or recessed structure corresponding to the recesses or grooves, filling the space formed in the pattern area 424.

Figure 9A:
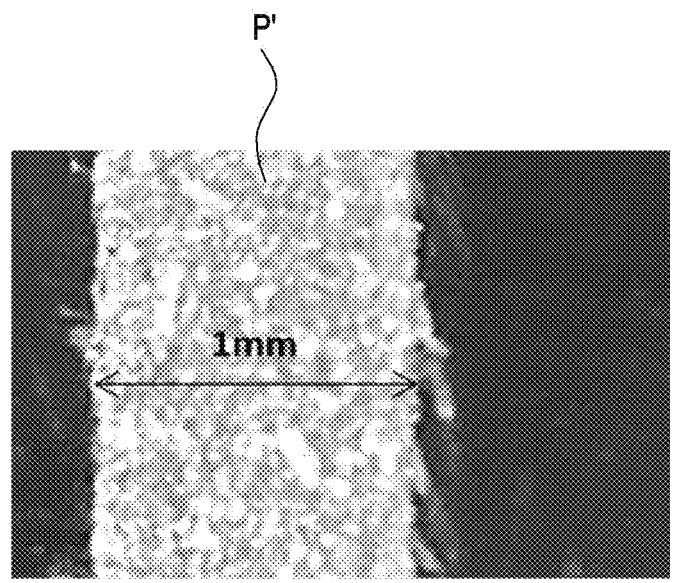
FIG. 9A is an enlarged, cross-sectional view illustrating a pattern area of a rear plate of an example electronic device according to certain embodiments of the disclosure.
Figure 9B:
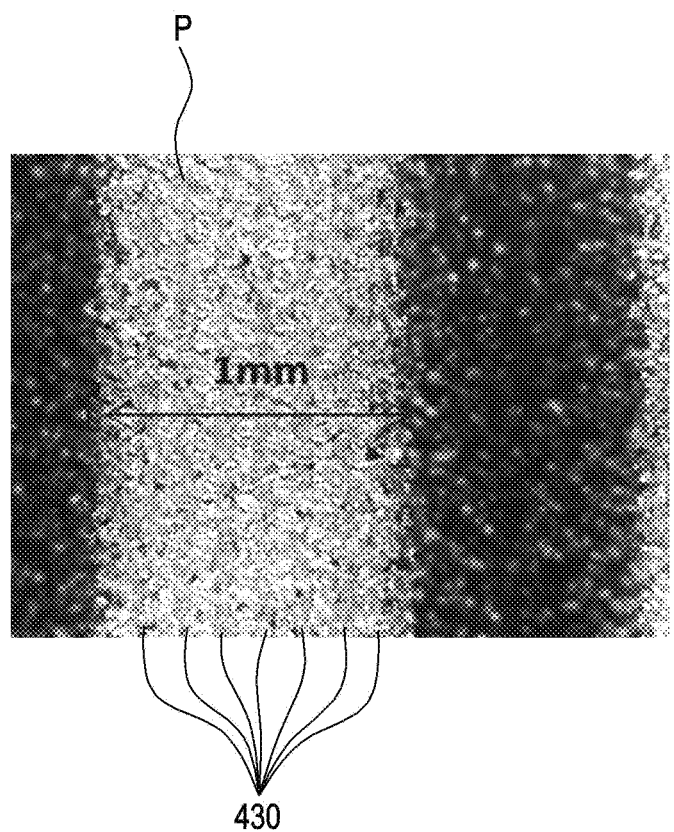
FIG. 9B is an enlarged, cross-sectional view illustrating a pattern area obtained by processing a rear plate using a laser according to an embodiment of the disclosure.

FIG. 9A is an enlarged, cross-sectional view illustrating a pattern area of a rear plate of an electronic device according to certain embodiments of the disclosure. FIG. 9B is an enlarged, cross-sectional view illustrating a pattern area obtained by processing a rear plate using a laser according to an embodiment of the disclosure.

According to certain embodiments, an electronic device (e.g., the electronic device 101 of FIGS. 1 to 3) may include a rear plate 380, and the rear plate 380 may include a glass plate 381 including a pattern area 421. The configuration of the glass plate 381 of FIGS. 9A and 9B may be identical in whole or part to the configuration of the glass plate 381 of FIGS. 5 and 6.

Referring to FIG. 9A, the pattern area 421 of the glass plate 381 may include a pattern P having a designated shape and a plurality of processing lines 430 forming regular lines inside the pattern P. The processing lines 430 may be spaced apart from each other. The plurality of processing lines 430 may be a pattern formed by thermoforming, and may appear as a processing pattern of the machine processing the thermoforming mold is transferred into the pattern area 421. The plurality of processing lines 430, together with the pattern of the designated shapes, may provide an aesthetic design to the glass plate 381.

On the other hand, referring to FIG. 9B, a cross section of a glass plate including a pattern formed by a laser may be identified. The pattern formed by laser includes an irregular processed surface and exhibits cracks due to fusion by laser processing and, as compared with the present disclosure, is less aesthetic. Further, unlike the invention disclosed herein, the pattern formed by laser lacks thermoformed processing lines and thus fails to form a pattern area that gives a sense of depth.

A process for manufacturing a rear plate of an electronic device is described below.

Figure 10A:
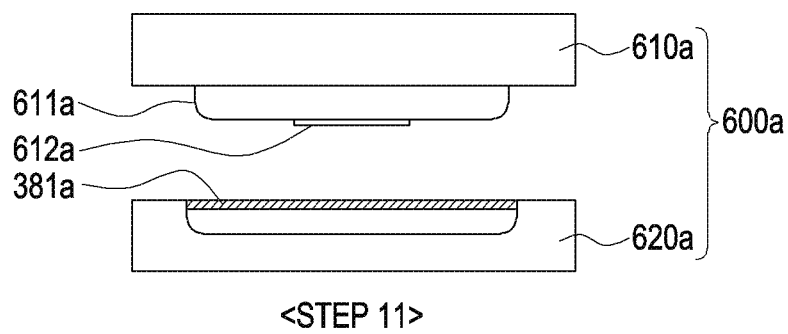
FIGS. 10A and 10B are drawings illustrating an example process for manufacturing a rear plate of an electronic device according to an embodiment of the disclosure.
Figure 10A:
Figure 10A:
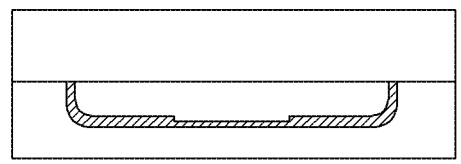
Figure 10A:
Figure 10A:
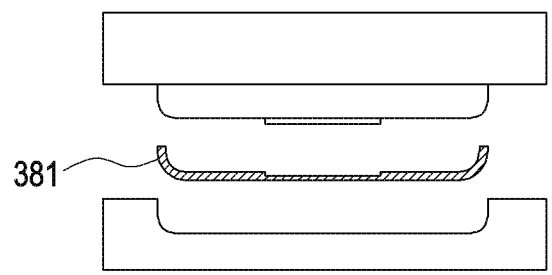
Figure 10B:
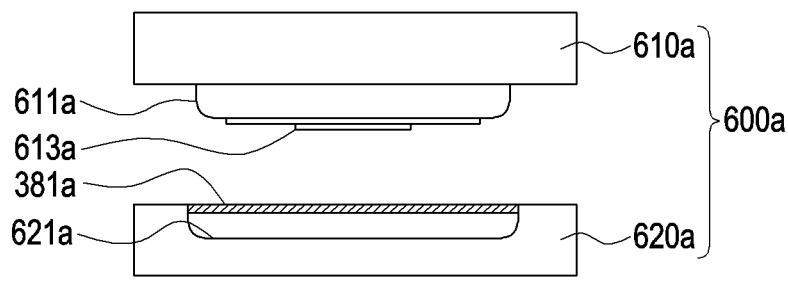
Figure 10B:
Figure 10B:
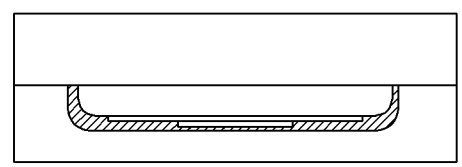
Figure 10B:
Figure 10B:
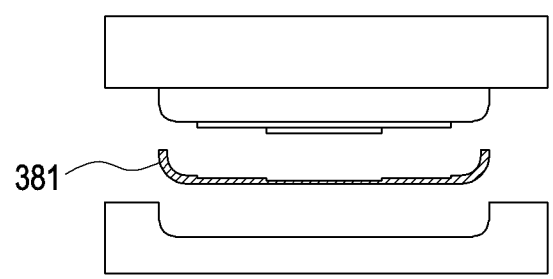

FIGS. 10A and 10B are drawings illustrating a process for manufacturing a rear plate of an electronic device according to an embodiment of the disclosure.

According to certain embodiments, the process of manufacturing a rear plate 380 may be performed in the order of computer numerical control (CNC) (cutting and processing), edge polishing, thermoforming, polishing, reinforcing, and coating layer formation.

According to certain embodiments of the disclosure, an additional process, such as printing film lamination for patterning, which used to be provided after coating layer formation, may be excluded, and patterning may be performed during thermoforming.

According to certain embodiments, by thermoforming, a glass 381a which is formed of an overall flat plate may be inserted into the mold structure and be formed into a plate having a specific structure. For example, a glass including a flat area and a curved area (hereinafter, referred to as a 3D glass 381) may be manufactured during thermoforming and be used in an electronic device.

Referring to FIGS. 10A and 10B, according to step 11, a pre-process glass 381a may be inserted into the first mold structure 600a. According to an embodiment, the first mold structure 600a for manufacturing the rear plate 380 of the electronic device may include a first upper core structure 610a and a first lower core structure 620a. The first upper core structure 610a and/or the first lower core structure 620a may partially include shape processing portions 611a and 621a for forming the overall shape of the glass 381. As another example, in an areas of the shape processing portion 611a or 621a of the upper core structure 610a and/or the lower core structure 620a, an engraved and/or embossed pattern portion 612a or 613a for forming a pattern in an area of the glass 381 may be formed.

According to an embodiment, the shape processing portions 611a and 621a may be formed on the bottom of the first upper core structure 610a and the top of the first lower core structure 620a, respectively. The shape processing portions 611a and 621a have a flat surface in the middle and curved surfaces at the edges, so that the glass 381a may be formed as a 3D glass 381. For example, the shape processing portion 611a of the first upper core structure 610a may protrude toward the first lower core structure 620a, and the first lower core structure 620a may be recessed corresponding to the protrusion.

According to an embodiment, the pattern portion 612a or 613a may be formed on one surface of the shape processing portion 611a of the first upper core structure 610a. For example, referring to FIG. 10A, the first pattern portion 612a may be a pattern shaped to have a single or uniform height. As another example, referring to FIG. 10B, the second pattern portion 613a may be a pattern formed in multiple steps or having a 3D shape including slopes. The glass 381a may be positioned so that an area thereof, which utilizes a pattern, faces the first pattern portion 612a or the second pattern portion 613a.

According to step 12, the first upper core structure 610a may be lowered and coupled to the first lower core structure 620a. The glass 381a disposed between the first upper core structure 610a and the first lower core structure 620a may be expanded by internal high-temperature preheating. As the first upper core structure 610a and the first lower core structure 620a are coupled and pressure is transmitted, the glass 381a may be molded into an overall shape according to the shape processing portions 611a and 621a. Further, the pattern shape of the pattern portion 612a or 613a may be simultaneously formed in one area of the glass 381a. For example, when the pattern of the first pattern portion 612a is transferred according to FIG. 10A, the glass may have a pattern area in which a pattern of a single height is formed. As another example, when the pattern of the second pattern portion 613a is transferred according to FIG. 10B, the glass may have a pattern area formed in multiple steps or in a 3D shape having slopes.

According to step 13, when the formation of the glass is complete, the overall shape of the 3D glass 381 including the three patterns may be complete by cooling.

According to an embodiment of the present disclosure, it is possible to form an overall shape of a rear plate of an electronic device while simultaneously forming a pattern in a portion by thermoforming as described above. Thus, no additional printing film lamination process is utilized, saving time and processing costs and providing an aesthetic design by a thermoformed pattern.

Figure 11:
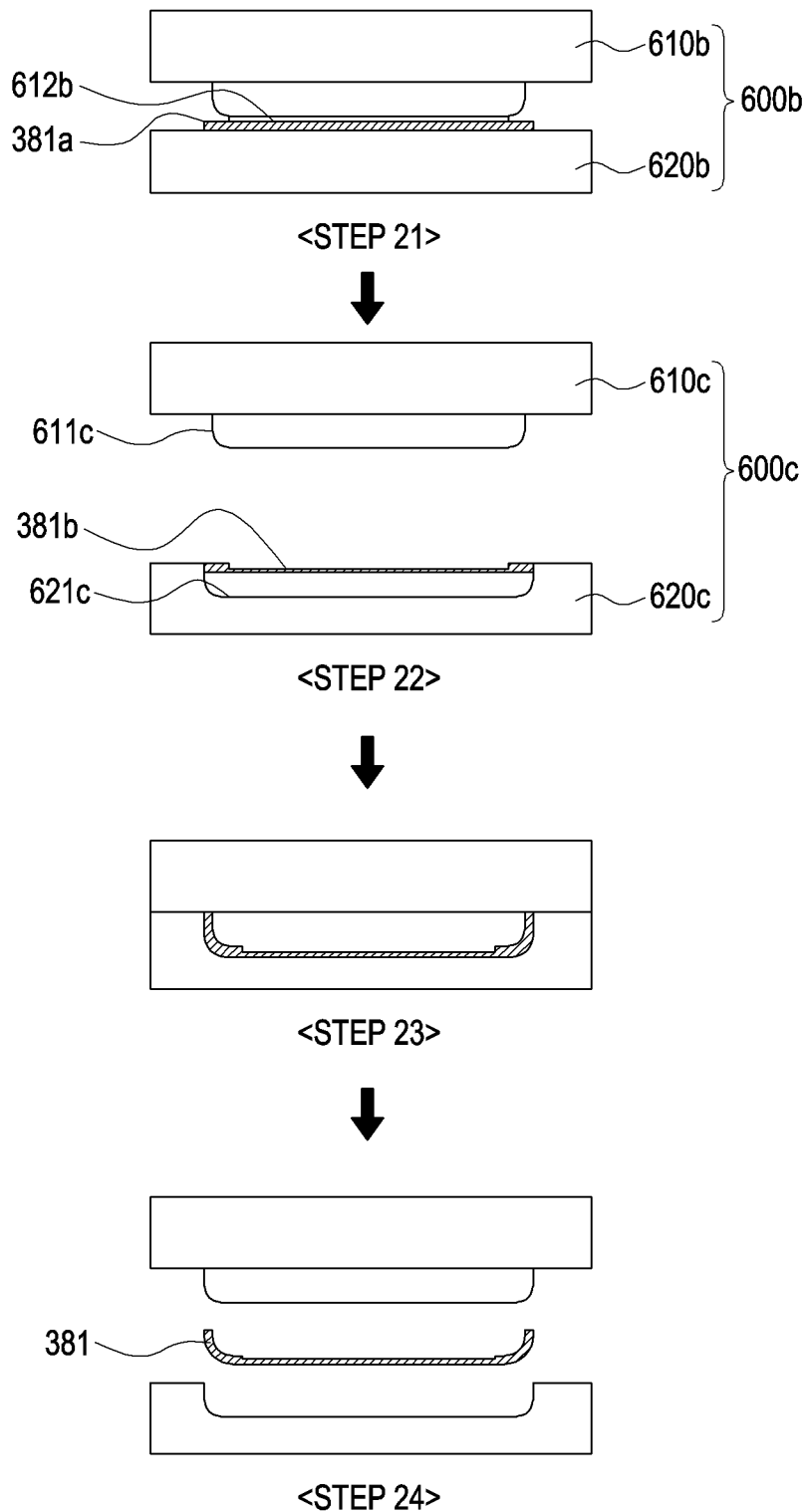
FIG. 11 is a drawing illustrating an example process for manufacturing a rear plate of an electronic device according to another embodiment of the disclosure.

FIG. 11 is a drawing illustrating a process for manufacturing a rear plate of an electronic device according to another embodiment of the disclosure.

The process of manufacturing the rear plate 380 as shown in FIG. 10 may be applied to an overall manufacturing process for the rear plate 380 according to certain embodiments. However, according to an embodiment of the present disclosure, a different process for forming a 3D pattern from the sequence of steps of FIG. 10 may apply.

According to certain embodiments, using a process of thermoforming, a glass 381a which is formed of an overall flat plate may be inserted into the mold structure and be formed into a plate having a specific structure. For example, a glass including a flat area and a curved area (hereinafter, referred to as a 3D glass 381) may be manufactured during thermoforming and be used in an electronic device.

According to step 21, a step for forming a pattern may be performed. The pre-processing glass 381a may be injected into the second mold structure 600b. According to an embodiment, the second mold structure 600b may include a second upper core structure 610b and a second lower core structure 620b. The pattern portion 612b for transferring a pattern to the pre-processing glass 381a may be formed on one surface of the second upper core structure 610b. For example, the pattern portion 612b may be a pattern having a shape of a single height. As another example, the second pattern portion 613a may be a pattern formed in multiple steps or having a 3D shape including slopes. The second lower core structure 620b may be provided as a flat surface capable of supporting one entire surface of the pre-processing glass 381a.

According to an embodiment, the second upper core structure 610b may descend to press the glass 381a disposed in the second lower core structure 620b. The pattern shape of the pattern portion 612b may be formed in an area of the glass 381a disposed between the second upper core structure 610b and the second lower core structure 620b by high-temperature preheating inside the mold and/or pressure transfer.

The patterned glass 381b may be inserted into a third mold structure 600c according to step 22. According to an embodiment, the third mold structure 600c may include a third upper core structure 610c and a third lower core structure 620c. The shape processing portions 611c and 621c may be provided on the bottom of the third upper core structure 610c and the top of the third lower core structure 620c. The shape processing portions 611c and 621c have a flat surface in the middle and curved surfaces at the edges, so that the patterned glass 381b may be formed as a 3D glass 381.

According to step 23, the third upper core structure 610c may be coupled to the third lower core structure 620c. The patterned glass 381b disposed between the third upper core structure 610c and the third lower core structure 610c may be expanded by internal high-temperature preheating. As the third upper core structure 610c and the third lower core structure 620c are coupled and pressure is transferred, the patterned glass 381b may be subjected to formation of an overall shape according to the shape processing portions 611c and 621c.

According to step 24, when the formation of the glass is complete, the overall shape of the 3D glass 381 including the pattern area may be complete by cooling. The pattern area may include a pattern having a shape of a single height formed in the second upper core structure 610c or a pattern formed in multiple steps or having a 3D shape including slopes.

Figure 12:
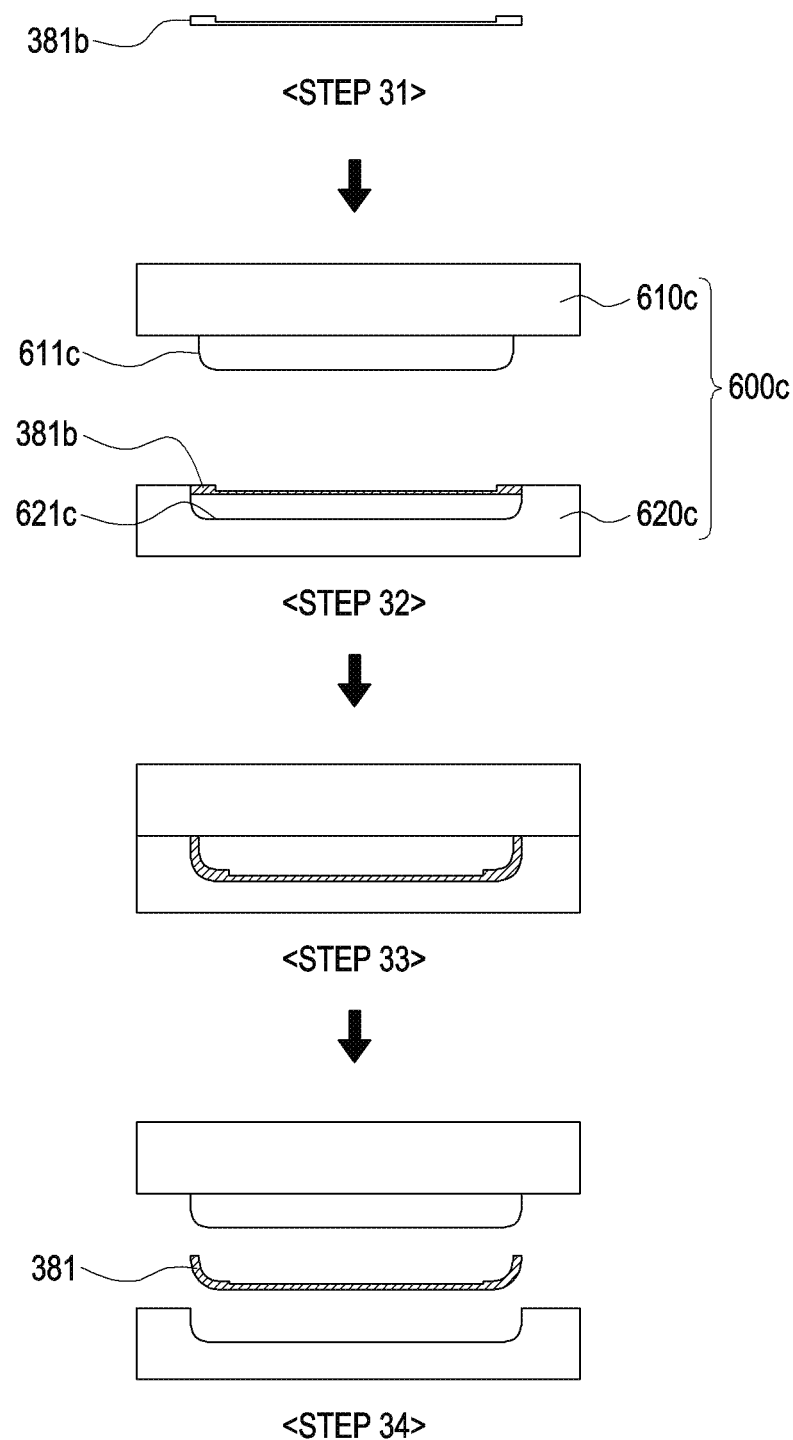
FIG. 12 is a drawing illustrating an example process for manufacturing a rear plate of an electronic device according to another embodiment of the disclosure.

FIG. 12 is a drawing illustrating a process for manufacturing a rear plate of an electronic device according to another embodiment of the disclosure.

The process of manufacturing the rear plate 380 as shown in FIG. 10 may be applied to an overall manufacturing process for the rear plate 380 according to certain embodiments. According to certain embodiments of the disclosure, the glass 381b in which the pattern area 421 has already been included may be processed to form a 3D pattern in a manner different from that shown in FIG. 10.

According to step 31, a glass material may be prepared which has the pattern area 421. For example, the pattern formed in the glass material may be a pattern having a shape of a single height or a pattern formed in multiple steps or having a 3D shape including slopes.

The patterned glass 381b may be inserted into a third mold structure 600c according to step 32. According to an embodiment, the third mold structure 600c may include a third upper core structure 610c and a third lower core structure 620c. The shape processing portions 611c and 621c may be provided on the bottom of the third upper core structure 610c and the top of the third lower core structure 620c. The shape processing portions 611c and 621c have a flat surface in the middle and curved surfaces at the edges, so that the patterned glass 381b may be formed as a 3D glass 381.

According to step 33, the third upper core structure 610c may be coupled to the third lower core structure 620c. The patterned glass 381b disposed between the third upper core structure 610c and the third lower core structure 610c may be expanded by internal high-temperature preheating. As the third upper core structure 610c and the third lower core structure 620c are coupled and pressure is transferred, the patterned glass 381b may be subjected to formation of an overall shape according to the shape processing portions 611c and 621c.

According to step 34, when the formation of the glass is complete, the overall shape of the 3D glass 381 including the pattern may be complete by cooling.

Figure 13:
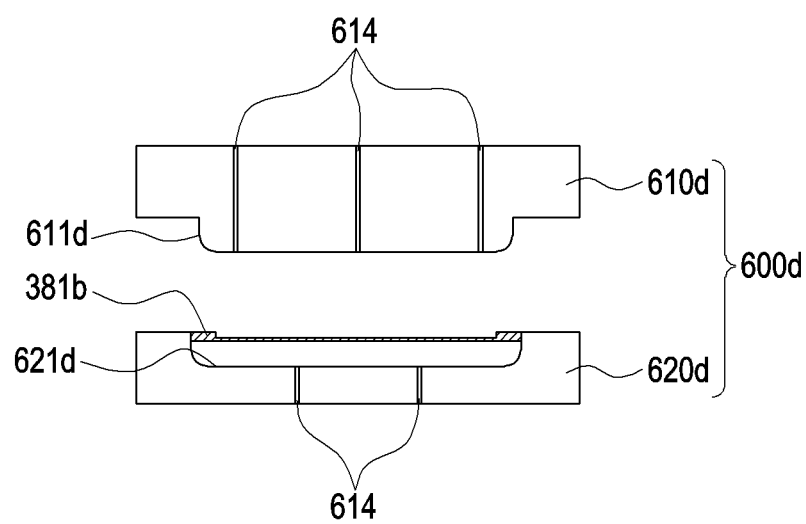
FIG. 13 is a view illustrating an example mold structure for manufacturing a rear plate of an electronic device according to certain embodiments of the disclosure.

FIG. 13 is a view illustrating a mold structure for manufacturing a rear plate of an electronic device according to certain embodiments of the disclosure.

According to certain embodiments, the process of manufacturing the rear plate 380 as shown in FIGS. 10A, 10B, 11, and 12 may be applied to an overall manufacturing process for the rear plate 380 according to certain embodiments. According to certain embodiments of the disclosure, a suction portion may be mounted on the mold structure to enhance patterning of the glass.

According to certain embodiments, in thermoforming, a 3D glass including a flat portion and curved portions may be manufactured through a fourth mold structure 600d and used. Referring to FIG. 13, thermoforming using the fourth mold structure 600d disclosed may be additionally provided in step 12 of FIGS. 10A and 10B. As another example, it may be added to step 23 of FIG. 11. As another example, it may be added to step 33 of FIG. 12.

According to an embodiment, the glass 381b including the pattern area 421 may be inserted into the fourth mold structure 600d. The fourth mold structure 600d may include a fourth upper core structure 610d and a fourth lower core structure 620d. The shape processing portions 611d and 621d may be provided on the bottom of the fourth upper core structure 610d and the top of the fourth lower core structure 620d. The shape processing portions 611d and 621d have a flat surface in the middle and curved surfaces at the edges, so that the glass may be formed as a 3D glass.

According to an embodiment, the fourth upper core structure 610d and the fourth lower core structure 620d may include a suction portion 614 including at least one suction. For example, the fourth upper core structure 610d may include a plurality of suctions connected to an exterior through the shape processing portion 611d. The plurality of suctions may operate in the pattern area 421 of the glass to enhance the transferability of the pattern during thermoforming. A suction operation or an exhaust operation may be performed according to the pattern shape (e.g., engraved or embossed) of the glass. As another example, the fourth upper core structure 620d may include a plurality of suctions connected to an exterior through the shape processing portion 621d. The plurality of suctions may operate in the pattern area 421 of the glass to enhance the transferability of the pattern during thermoforming. A suction operation or an exhaust operation may be performed according to the pattern shape (e.g., engraved or embossed) of the glass.

According to an embodiment, the suction portions 614 individually disposed in the fourth upper core structure 610d and the fourth lower core structure 620d may be used simultaneously or sequentially, or one of them may be used singly. As another example, the suction portion 614 may operate to form the overall shape of the glass.

Figure 14:
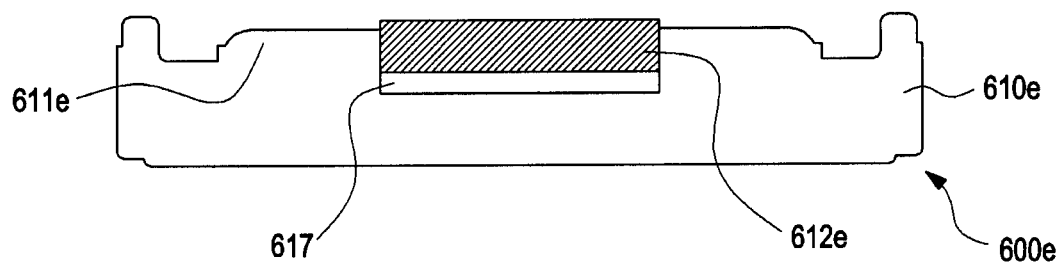
FIG. 14 is a view illustrating an example mold structure for manufacturing a rear plate of an electronic device according to certain embodiments of the disclosure.

FIG. 14 is a view illustrating a mold structure for manufacturing a rear plate of an electronic device according to certain embodiments of the disclosure.

According to certain embodiments, the process of manufacturing the rear plate 380 as shown in FIGS. 10A, 10B, 11, and 12 may be applied to an overall manufacturing process for the rear plate 380 according to certain embodiments. According to certain embodiments of the disclosure, a position adjustment portion may be mounted on the mold structure to enhance patterning of the glass.

According to certain embodiments, in thermoforming, a 3D glass including a flat portion and curved portions may be manufactured through a fifth mold structure 600e and used. Referring to FIG. 14, the configuration of the fifth mold structure 600e including the position adjustment portion 617 as disclosed may be applied to the mold structure of FIGS. 10A and 10B, 11 and 12, or 13.

According to certain embodiments, a shape processing portion 611e for forming an overall shape of the glass may be provided on one area of the fifth upper core structure 610e of the fifth mold structure 600e for manufacturing the rear plate of the electronic device 101. As another example, a pattern portion 612e engraved and/or embossed to form a patter in an area of the glass may be provided in another area of the upper core structure 610.

According to an embodiment, the pattern portion 612e may be formed as a core that is separable from the shape processing portion 611e, so that a pattern portion having various patterns desired by the worker may be selected and mounted according to his preference.

According to an embodiment, the fifth upper core structure 610e may further include a position adjustment portion 617 disposed on one surface of the pattern portion 612e. The position adjustment portion 617 is manufactured to have a size corresponding to the pattern portion 612e, adjusting the height to allow the pattern portion 612e to stick beyond, or be indented from, the shape processing portion 611e. For example, the position adjustment portion 617 may be provided in an area where the pattern transfer to the glass is difficult, implementing a glass having an enhanced pattern shape.

Figure 15:
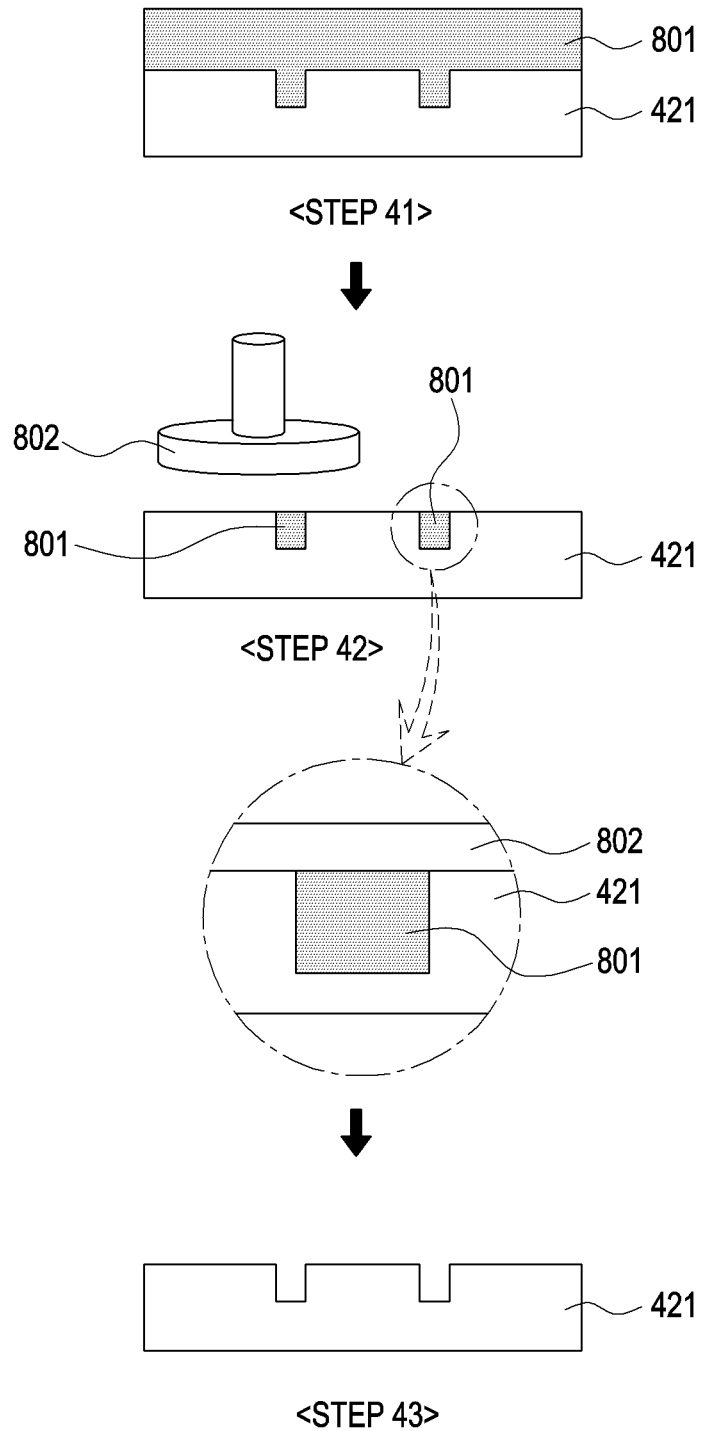
FIG. 15 is a drawing illustrating an example post-thermoforming process according to certain embodiments of the disclosure.

FIG. 15 is a drawing illustrating a post-thermoforming process according to certain embodiments of the disclosure.

According to certain embodiments, the process of manufacturing the rear plate 380 as shown in FIGS. 10A, 10B, 11, and 12 may be applied to an overall manufacturing process for the rear plate according to certain embodiments. According to certain embodiments of the disclosure, after glass patterning, the entire area of the glass is subjected to polishing, thereby providing a smooth surface, enhancing roughness, mitigating haze, and allowing for thickness grinding.

According to certain embodiments, after thermoforming, polishing may be performed. For polishing, according to step 41, resin coating and hardening may first be performed. According to an embodiment, a UV resin may be used for resin coating, and after a coating layer 801 is formed at a thickness capable of covering the recessed or protruding portion of the pattern area 421 of the glass, hardening may be performed.

Thereafter, according to step 42, polishing using a polishing pad 802 may be performed. The polishing pad 802 may remove the resin coating layer 801 formed around the pattern having a designated shape while simultaneously polishing the entire top surface of the glass. In polishing, one surface of the resin coating layer inserted into each shape of the pattern of the designated shape may be coplanar or flush with the top surface of the glass. Accordingly, the polishing pad 802 may be prevented from polishing the edge area of each shape of the pattern, and the shape of the pattern may be avoided from being crushed or polished out.

An entire shape of the 3D glass including the polished 3D pattern may be complete by peeling off the resin coating layer inserted into each shape of the pattern according to step 43 after polishing.

Figure 16:
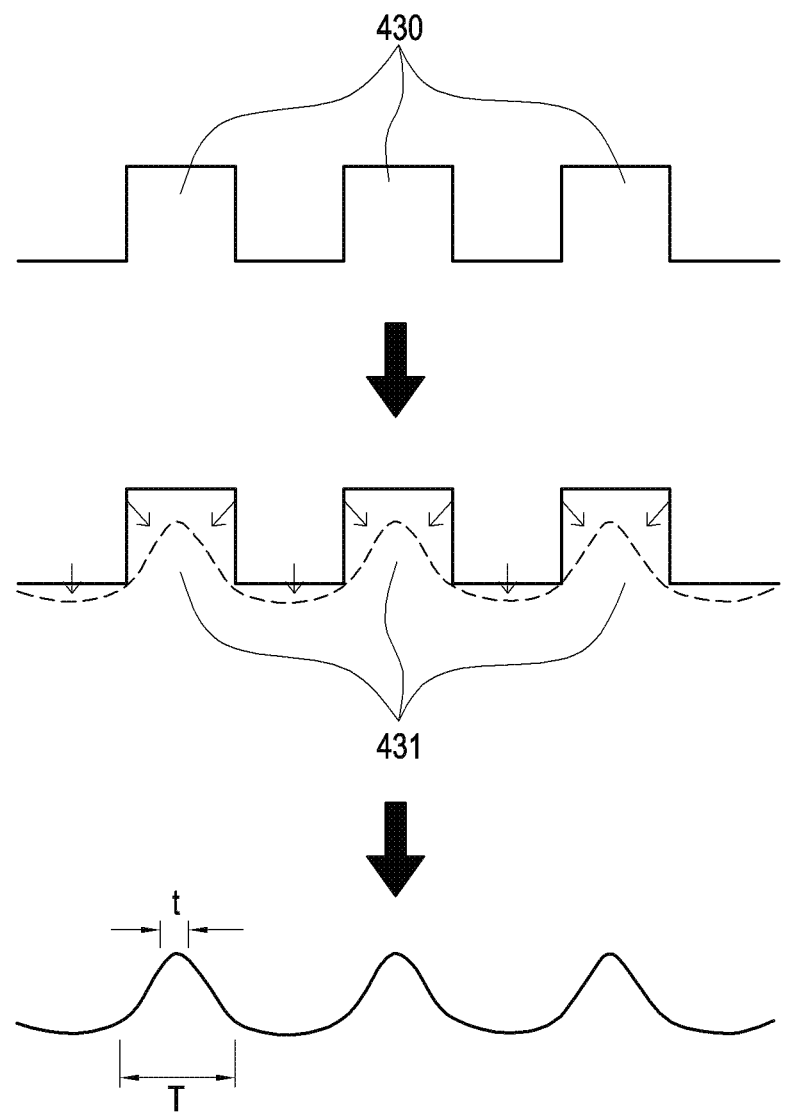
FIG. 16 is a drawing illustrating an example process for processing lines including slopes according to certain embodiments of the disclosure.

FIG. 16 is a drawing illustrating a process for processing lines including slopes according to certain embodiments of the disclosure.

According to certain embodiments, the process of manufacturing the rear plate 380 as shown in FIGS. 10A, 10B, 11, and 12 may be applied to an overall manufacturing process for the rear plate according to certain embodiments. According to certain embodiments of the disclosure, after glass patterning, the entire area of the glass is subjected to polishing, thereby providing a smooth surface, enhancing roughness, mitigating haze, and allowing for thickness grinding.

According to certain embodiments, after thermoforming, polishing may be performed. A plurality of processing lines 430 may be formed in the pattern area of the rear plate. To make the rear plate aesthetic, portions of the plurality of processing lines 430, which are relatively more exposed to an exterior, may be removed by polishing. For example, each of the processing lines 430 which are shaped as rectangular or circular cylinders may be polished at sides to thus have a designated slope.

According to certain embodiments, each processing line 431 may have an upper end and a lower end different in area from each other. As polishing is conducted starting from the externally exposed area, each processing line 431 may be shaped so that the upper end is narrowed and the lower end is relatively wider than the upper end. For example, at cross sectional view of the processing lines 431 of FIG. 16, the length of the upper end is t, and the length of the lower end is T, where T is larger than t.

According to certain embodiments, as polishing proceeds, the depth of the processing lines 431 may decrease, and the angle of the designated slope may increase. For example, each processing line 431 may transform into a triangular or quadrangular pyramid as the difference between the upper end and the lower end increases.

According to certain embodiments of the disclosure, a rear plate (e.g., the rear plate 380 of FIG. 5) covering a rear surface of an electronic device (e.g., the electronic device 101 of FIGS. 1 to 3) may include a glass plate (e.g., the glass plate 381 of FIG. 5) including a pattern area (e.g., the pattern area 421 of FIG. 5) including a pattern having a designated shape, in at least a partial area, a printed layer (e.g., the printed layer 382 of FIG. 5) disposed on a first surface of the glass plate, a shielding layer (e.g., the shielding layer 383 of FIG. 5) stacked with the printed layer, and a coating layer (e.g., the coating layer 384 of FIG. 5) disposed on a second surface, opposite to the first surface, of the glass plate. The pattern area of the glass plate may include a plurality of processing lines (e.g., the processing lines 430 of FIG. 5) spaced apart from each other.

According to certain embodiments, the plurality of processing lines may be arranged in a direction substantially perpendicular to one surface on which the pattern having the designated shape is formed.

According to certain embodiments, the glass plate may include a first surface (e.g., the first surface 3811) facing in the first direction and a second surface (e.g., the second surface 3812 of FIG. 5) facing in the second direction. The pattern area may be formed on at least one of the first surface or the second surface.

According to certain embodiments, the pattern having the designated shape formed in the pattern area may include a shape of a single height.

According to certain embodiments, the pattern having the designated shape, formed in the pattern area, may be formed in multiple steps or has a three-dimensional (3D) shape including a slope.

According to certain embodiments, the pattern having the designated shape formed in the pattern area may include a curved surface.

According to certain embodiments, the glass plate may include a flat area and curved areas formed along two opposite ends of the flat area. The pattern area may be formed in at least one of the flat area or the curved areas.

According to certain embodiments, a structure including the flat area and the curved areas of the glass plate and the pattern area may be shaped by thermoforming.

According to certain embodiments, the pattern area formed on the first surface may include a structure recessed inward of the glass plate or a structure protruding outward of the glass plate.

According to certain embodiments, the pattern area formed on the second surface may include a structure recessed inward of the glass plate or a structure protruding outward of the glass plate.

According to certain embodiments, the rear plate may further include a deposition layer disposed between the glass plate and the printed layer, and a transparent member layer (e.g., the transparent member layer 385 of FIG. 5) disposed between the glass plate and the deposition layer. At least a portion of the transparent member layer may be provided as an optically transparent adhesive layer to adhere the glass plate and the deposition layer.

According to certain embodiments, the rear plate may further include a transparent member layer disposed between the glass plate and the deposition layer. At least a portion of the transparent member layer may be provided as an optically transparent adhesive layer and directly coupled to the printed layer. The printed layer may be rendered to have a color by color printing.

According to certain embodiments of the disclosure, an electronic device (e.g., the electronic device 101 of FIGS. 1 to 3) may include a housing (e.g., the housing 310 of FIG. 2) including a front plate (e.g., the front plate 320 of FIG. 5) facing in a first direction and a rear plate (e.g., the rear plate 380 of FIG. 5) facing in a second direction opposite to the front plate, at least a portion of the front plate including a transparent area, a battery (e.g., the battery 350 of FIG. 4) disposed inside the housing, and a display (e.g., the display 330 of FIG. 4) disposed in the housing and including a screen area exposed through the front cover. The rear plate may include a glass plate (e.g., the glass plate 381 of FIG. 5) including a pattern area (e.g., the pattern area 421 of FIG. 5) including a pattern having a designated shape, in at least a partial area, a printed layer (e.g., the printed layer 382 of FIG. 5) disposed on the glass plate in the first direction, a shielding layer (e.g., the shielding layer 383 of FIG. 5) stacked with the printed layer, and a coating layer (e.g., the coating layer 384 of FIG. 5) disposed on the glass plate in the second direction opposite to the first direction. The pattern area of the glass plate may include a plurality of processing lines (e.g., the processing lines 430 of FIG. 5) spaced apart from each other.

According to certain embodiments, virtual lines (e.g., the virtual lines L of FIG. 5) formed along respective centers of the plurality of processing lines may be arranged in parallel with one another. Each of the plurality of processing lines may have an upper end and a lower end different in area from each other.

According to certain embodiments, the glass plate may include a flat area and curved areas formed along two opposite ends of the flat area. The pattern area may be formed in at least one of the flat area or the curved areas.

According to certain embodiments, the rear plate may further include a transparent member layer disposed between the glass plate and the printed layer. At least a portion of the transparent member layer may be provided as an optically transparent adhesive layer and directly coupled to the printed layer. The printed layer may be rendered to have a color-by-color printing.

According to certain embodiments of the disclosure, a method for manufacturing a rear plate may include a step in which a glass plate is inserted into a mold structure and is seated in an area of a lower core structure of the mold structure, a step in which the glass plate is pre-heated at a high temperature, and an upper core structure of the mold structure descends toward the lower core structure, a step in which shape processing portions of the upper core structure and the lower core structure press the glass plate to form a curved surface, and a cooling step.

According to certain embodiments, the method may further include a step in which a pattern portion formed in the upper core structure or the lower core structure presses the glass plate to transfer a pattern having a designated shape while forming the curved surface of the glass plate in the forming step.

According to certain embodiments, the method may further include the step of forming a pattern having a designated shape on one surface or two opposite surfaces of the glass plate before the glass plate is inserted into the mold structure.

According to certain embodiments, the pattern having the designated shape of the glass plate may include a plurality of processing lines spaced apart from each other by thermoforming.

According to certain embodiments, the method may further include polishing after the pattern forming step and, during polishing, each of the plurality of processing lines may form a designated slope on at least one surface.

It is apparent to one of ordinary skill in the art that an electronic device including a rear plate and a method for manufacturing the same according to certain embodiments of the present disclosure as described above are not limited to the above-described embodiments and those shown in the drawings, and various changes, modifications, or alterations may be made thereto without departing from the present disclosure.

The invention claimed is:

1. A rear plate for forming a rear exterior surface of an electronic device, including:
   a glass plate including a pattern area, the pattern area including a pattern having a designated shape, in at least a partial area of the glass plate;
   a shielding layer disposed at a first side of the glass plate, for shield light directed to an exterior or an interior of the electronic device;
   a printed layer disposed between the shielding layer and the glass plate; and
   a coating layer disposed at a second side of the glass plate opposite to the first side; and
   a transparent member layer disposed between the glass plate and the printed layer, and including a dielectric layer disposed in contact with the glass plate and formed of an acrylic adhesive,
   wherein the pattern area of the glass plate includes a plurality of lines spaced apart from each other, wherein the plurality of lines is formed along a direction of virtual lines (L) perpendicular to a surface of the glass plate, and each of the virtual lines (L) of each of the plurality of lines are arranged in a direction parallel to the surface of the glass plate, and
   wherein the plurality of lines protrudes toward the transparent member layer and is disposed in contact with the transparent member layer.

2. The rear plate of claim 1, wherein the plurality of lines is arranged in a direction substantially perpendicular to one side on which the pattern having the designated shape is formed.

3. The rear plate of claim 1, wherein the pattern area is disposed on at least one of the first side or the second side.

4. The rear plate of claim 3, wherein the designated shape includes a uniform height along a top of the designated shape.

5. The rear plate of claim 3, wherein the pattern having the designated shape is formed in multiple steps and/or defines a three-dimensional (3D) shape including a slope.

6. The rear plate of claim 5, wherein the pattern having the designated shape includes a curved surface.

7. The rear plate of claim 1, wherein the glass plate includes a flat area and curved areas, in which the curved areas are formed along ends of the flat area, and wherein the pattern area is formed in the flat area and the curved areas.

8. The rear plate of claim 3, wherein the pattern area included on the first side includes a structure recessed inwards relative to the glass plate, or a structure protruding outwards relative to the glass plate.

9. The rear plate of claim 3, wherein the pattern area included on the second side includes a structure recessed inwards relative to the glass plate, or a structure protruding outwards relative to the glass plate.

10. The rear plate of claim 1, further comprising:
a deposition layer disposed between the glass plate and the printed layer; and
the transparent member layer disposed between the glass plate and the deposition layer,
wherein at least a portion of the transparent member layer includes an optically transparent adhesive layer adhering the glass plate to the deposition layer.

11. The rear plate of claim 1, further comprising:
wherein at least a portion of the transparent member layer includes an optically transparent adhesive layer directly coupled to the printed layer, and
wherein the printed layer includes a color via color printing.

12. The rear plate of claim 1, wherein each of the lines defines a three-dimensional (3D) shape including a curved surface.

13. An electronic device, comprising:
a housing, including a front plate and a rear plate facing opposite to the front plate, wherein at least a portion of the front plate includes a transparent area;
a battery disposed within the housing; and
a display coupled to the housing and including a screen area exposed through the front plate,
wherein the rear plate includes:
a glass plate including a pattern area, the pattern area including a pattern having a designated shape, in at least a partial area of the rear plate;
a shielding layer disposed at a first side of the glass plate, for shield light directed to an exterior or an interior of the electronic device
a printed layer disposed between the shielding layer and glass plate; a coating layer disposed at a second side of the glass plate opposite to the first side; and
a transparent member layer disposed between the glass plate and the printed layer, and including a dielectric layer disposed in contact with the glass plate and formed of an acrylic adhesive,
wherein the pattern area of the glass plate includes a plurality of processing lines spaced apart from each other,
wherein the plurality of lines is formed along a direction of virtual lines (L) perpendicular to a surface of the glass plate, and each of the virtual lines (L) of each of the plurality of lines are arranged in a direction parallel to the surface of the glass plate, and
wherein the plurality of lines protrudes toward the transparent member layer and is disposed in contact with the transparent member layer.

14. The electronic device of claim 13, wherein each of the lines defines a three-dimensional (3D) shape including a curved surface.

* * * * *